United States Patent [19]

Minonishi et al.

[11] Patent Number: 4,716,094
[45] Date of Patent: Dec. 29, 1987

[54] PHOTOSENSITIVE RESIN COMPOSITION WHICH IS IMPROVED WITH RESPECT TO SURFACE TACK-FREE CHARACTERISTIC AFTER CURING, AND A METHOD

[75] Inventors: Kuniaki Minonishi; Reijirō Satō, both of Fuji, Japan

[73] Assignee: Asahi Kasei Kogyo Kabushiki Kaisha, Osaka, Japan

[21] Appl. No.: 709,186

[22] Filed: Mar. 7, 1985

[30] Foreign Application Priority Data

Mar. 13, 1984 [JP] Japan .................................. 59-46472

[51] Int. Cl.$^4$ .......................... G03C 1/68; G03C 1/70
[52] U.S. Cl. ..................................... 430/284; 430/281; 430/306; 522/96; 522/78; 522/79
[58] Field of Search ....................... 430/284, 306, 281; 522/96, 78, 79

[56] References Cited

U.S. PATENT DOCUMENTS

| | | | |
|---|---|---|---|
| 3,157,501 | 11/1964 | Burrows et al. | 96/35 |
| 3,887,379 | 6/1975 | Clecak et al. | 430/286 X |
| 4,036,644 | 7/1977 | Kaplan et al. | 430/145 X |
| 4,057,431 | 11/1977 | Finelli et al. | 430/284 |
| 4,139,436 | 2/1979 | Jasani | 204/159.16 |
| 4,168,981 | 9/1979 | Donald et al. | 204/159.18 |
| 4,218,294 | 8/1980 | Brack | 522/78 X |
| 4,259,432 | 3/1981 | Kondoh et al. | 430/282 X |
| 4,268,576 | 5/1981 | Montmarquet, Jr. | 430/281 X |
| 4,292,392 | 9/1981 | Ikeda et al. | 430/299 X |
| 4,323,637 | 4/1982 | Chen et al. | 430/281 X |
| 4,386,153 | 5/1983 | Shinozaki et al. | 430/281 X |
| 4,481,281 | 11/1984 | Tsao et al. | 430/284 |

FOREIGN PATENT DOCUMENTS

| | | |
|---|---|---|
| 2314868 | 10/1973 | Fed. Rep. of Germany . |
| 2410880 | 9/1974 | Fed. Rep. of Germany . |
| 2641189 | 4/1977 | Fed. Rep. of Germany . |
| 50-31487 | 10/1975 | Japan . |
| 50-38964 | 12/1975 | Japan . |
| 58-97043 | 6/1983 | Japan . |

OTHER PUBLICATIONS

Chemical Abstract, vol. 87, No. 16, p. 63, No. 118959u.
Chemical Abstract, vol. 86, No. 18, p. 665, No. 131160a.

Primary Examiner—John E. Kittle
Assistant Examiner—Cynthia Hamilton
Attorney, Agent, or Firm—Birch, Stewart, Kolasch & Birch

[57] ABSTRACT

A photosensitive resin composition which is improved with respect to surface tack-free characteristic after curing by exposure to actinic radiation is disclosed. Further, there is disclosed a method of preparing a surface-tack free photocured pattern structure using the photosensitive resin composition, which enables pattern structures improved with respect to surface tack-free characteristic to be obtained in a shortened period of time.

7 Claims, 1 Drawing Figure

U.S. Patent   Dec. 29, 1987   Sheet 1 of 1   4,716,094

PHOTOSENSITIVE RESIN COMPOSITION WHICH IS IMPROVED WITH RESPECT TO SURFACE TACK-FREE CHARACTERISTIC AFTER CURING, AND A METHOD

This invention relates to a photosensitive resin composition, and more particularly to a photosensitive resin composition which is improved with respect to surface tack-free characteristics after curing by exposure to actinic radiation and which can provide pattern structures having improved surface tack-free characteristics. This invention also relates to a method of preparing a surface tack-free, photocured pattern structure using the photosensitive resin composition, which enables pattern structures improved with respect to surface tack-fee characteristics to be obtained in a reduced period of time.

The term "photocured pattern structure" used herein is intended to embrace a photorelief image and photoresist which have convex and concave portions and a depth of about 0.1 mm to 10 mm. The photocured pattern structure may be used as a letterpress, molding matrix, decorative material having convex and concave portions, and the like.

The process for preparing relief images essentially comprises an exposure step and a development step. In general, however, a post-exposure step is also included in order to improve the mechanical strength of the relief images and to reduce the surface tack of the relief images. Further, when the development is performed using a liquid developer, a drying step is involved.

Generally, with respect to the case where a photocurable resin layer is exposed to actinic radiation to form photocured relief images, the relief images prepared by the above-mentioned steps encounter difficulties in practical use as described later because the surface tack of the photocured relief images is still high. The surface tack of the photocured relief images are caused as follows. When a photocurable resin layer is irradiated with actinic radiation through an image-bearing transparency, the photocuring of the photocurable resin occurs, but the photocuring of surface portions of the photocurable resin layer is inhibited by oxygen, causing surface tack of top portions of the photocured relief images. In the case of certain kinds of photocurable resins, the surface tack of the photocured relief images obtained therefrom is considerably high. Further, since the actinic radiation is decreased with respect to intensity during its thickness-wise passing the photocurable resin layer, the photocuring of portions of the resin corresponding to the side and bottom portions of the convexes and concaves of the relief images is insufficient, leading to high surface tack of the relief images. When the development is performed using a developer containing water at a concentration of 50% or more, since the side and bottom portions which are insufficient in photocuring are difficult to dissolve in water, the side and bottom portions are apt to be tacky, leading to high surface tack of the relief images. In recent years, from the standpoints of waste liquid treatment and the improvement of the working environment, the development is mainly carried out using an aqueous surfactant solution, aqueous alkaline solution or water. Therefore, the surface tack of the photocured relief images is not improved and is still high.

Due to the surface tack of the photocured relief images, there are various problems which result. For example, in handling the photocured relief images, they adhere to the hands of workers and workability is decreased due to the adhesion of the photocured relief images to each other. Further dusts adhere to the photocured relief images, causing deterioration of the product quality. When the photocured relief images are used as printing plates, in addition to the above drawbacks, dusts such as paper dusts adhere to the printing areas (top portions of convexes of the relief images) and non-printing areas (side portions of the convexes and bottom portions of concaves of the relief images) during printing, making the printed articles dirty. This causes a need to stop the printing operation and to clean the printing plates by wiping thus, lowering the operation efficiency. Moreover, when the material to be printed is paper, peeling of paper is caused by the surface tack of the printing plates, reducing the yield of prints which is defined by the percentage of printed articles of good quality which can be sold as a product to the total number of printed articles.

To eliminate or diminish these disadvantages there have been proposed and adopted methods in which the surface of relief images is improved by chemical treatment or physical treatment, such as (i) a method in which the relief images are treated with an oxidant, reducing agent or the like, (ii) a method in which after preparing a relief image, a coating material is applied onto the surface of the relief image and (iii) a method in which the post-exposure of the relief images to actinic radiation is conducted in an inert gas or while dipping the relief images in a liquid so that oxygen does not inhibit the photocuring. As one example of the above method (i), there is known a method in which the inhibition of photocuring due to oxygen is eliminated using a reducing material or the like in the step of post-exposure (Japanese Patent Application Publications Nos. 50-38964 and 50-31487 and Japanese Patent Application Laid-Open Specification No. 58-97043). However, the above-mentioned methods are still defective because the surface tack-removing effect is insufficient. Further, with respect to the above method (ii), although a sufficient surface tack-removing effect is obtained, a troublesome step for application of a coating material is required and further a prolonged effect is not sufficiently ensured. The method (iii) is disclosed, for example, in Japanese Patent Application Laid-Open Specification No. 58-97043. However, this method is also still insufficient for removing surface tack.

Taking into consideration the above-mentioned problems involved in the conventional methods of removing the surface tack of a photocured resin, the present inventors have made extensive investigations with a goal to developing a new photosensitive material and a new method, whereby a photocured pattern structure free from surface tack problems can be advantageously obtained. As a result, the present inventors have found (1) that by incorporating into a photocurable resin composition at least one compound represented by the formula (I) which will be mentioned later, there can be obtained a photosensitive resin composition which has improved surface tack-free characteristics after curing by exposure to actinic radiation and (2) that when a photosensitive resin composition containing at least one compound representec by the formula (I) is used to prepare a photocured pattern structure and the photocured pattern structure is subjected to post-exposure to actinic radiation while being immersed in an aqueous solution containing an alkali metal salt or alkaline earth metal salt of sulfurous acid, there can be stably obtained a photocured pattern structure which is free from surface tack even immediately after the preparation thereof. Based on the findings, there present invention has been completed.

Accordingly, it is an object of the present invention to provide a photosensitive resin composition which is improved with respect to surface tack-free characteristics after curing by exposure to actinic radiation.

It is another object of the present invention to provide a method of preparing a surface tack-free photocured pattern structure using the photosensitive resin composition, which enables pattern structures having improved surface tack-free characteristics to be obtained in a decreased period of time.

Figure 1:
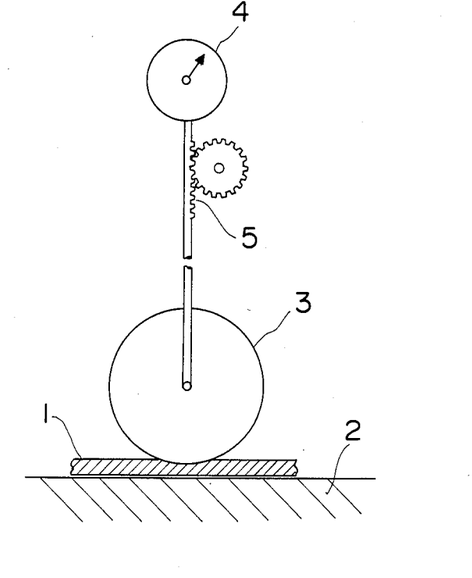

The foregoing and other objects, features and advantages of the present invention will be apparent to those skilled in the art from the following detailed description taken in connection with the accompanying drawing which is a schematic diagram of an apparatus for determining the surface tack of a photocured pattern structure.

In one aspect of the present invention, there is provided a photosensitive resin composition which is improved with respect to surface tack-free characteristic after curing by exposure to actinic radiation, comprising: a photocurable resin composition; and at least one compound (I) represented by the general formula (I), wherein $R^1$ represents a monovalent hydrocarbon residue represented by $C_nH_{2n+1}$ or $C_nH_{2n-1}$ in which n is an integer of from 11 to 21; and X represents —COOH, —CONH$_2$ or —CH$_2$OR$^2$ in which $R^2$ represents H or —CO—R$^3$—S—R$^3$—COOCH$_2$—R$^4$ in which $R^3$ is a divalent hydrocarbon residue having 1 to 6 carbon atoms and $R^4$ has the same meaning as R.

The photocurable resin composition to be used in the present invention is defined as those which are capable of being insolubilized upon exposure to actinic radiation.

As the photocurable resin composition to be used in the present invention, there may be mentioned various kinds of compositions. As examples of such composition there may be mentioned a composition comprising an ethylenically unsaturated material and photoinitiator; a composition comprising a binder polymer, ethylenically unsaturated material and photoinitiator; a composition comprising a polyene, polythiol and photoinitiator; and the like. In addition to the above compositions, a composition comprising a polymer having at least one cinnamoyl group and a photoinitiator may also be used as the photocurable resin composition. This composition is capable of absorbing ultraviolet rays (actinic radiation) very well. Therfore, when this composition is singly used as the photocurable resin composition, the actinic radiation is extremely decreased with respect to intensity its thickness-wise passing the layer of a photosensitive resin composition containing this composition. Hence, if the thickness of such a layer is too great, the photocuring of the layer is likely to be insufficient. From this viewpoint, a photosensitive resin composition containing, as the photocurable resin composition, a composition comprising a polymer having at least one cinnamoyl group and a photoinitiator may preferably be used for preparing a photocured pattern structure having a thickness of less than 1 mm. The composition comprising a polymer having at least one cinnamoyl group and a photoinitiator may be used in combination with an ethylenically unsaturated material.

A stabilizer may be added to the above-mentioned compositions to increase the storage stability of the compositions. Examples of the stabilizer will be mentioned later.

The term "ethylenically unsaturated material" used herein is intended to mean a prepolymer having at least one ethylenically unsaturated group (hereinafter often referred to as "ethylenically unsaturated prepolymer"), and an ethylenically unsaturated monomer.

The term "binder polymer" used herein is intended to mean a polymer compound which is not reactive with the ethylenically unsaturated compound.

The term "photoinitiator" used herein is intended to mean a compound which absorbs actinic rays to initiate or sensitize the photocuring reaction of a photocurable material in the resin composition to be used in the present invention.

When the photosensitive resin composition of the present invention is used for preparing a printing plate, from the viewpoints of high image-forming ability and high printing durability, a composition comprising an ethylenically unsaturated prepolymer, ethylenically unsaturated monomer and photoinitiator and a composition comprising a binder polymer, ethylenically unsaturated monomer and photoinitiator may preferably be used as the photocurable resin composition of the photosensitive resin composition.

With respect to the composition comprising an ethylenically unsaturated prepolymer, ethylenically unsaturated monomer and photoinitiator, an illustrative explanation will be given below.

As examples of the ethylenically unsaturated prepolymer, there may be mentioned unsaturated polyesters, ethylenically unsaturated prepolymer having at least one urethane bond such as unsaturated polyurethanes, unsaturated polyamides, unsaturated polyimides, unsaturated poly(meth)acrylates and various kinds of modified compounds thereof.

More specifically, as the unsaturated polyester, there may be mentioned unsaturated polyesters produced by the reaction of an unsaturated dibasic acid such as maleic acid, fumaric acid, itaconic acid or the like or an acid anhydride thereof and a polyhydric alcohol such as ethylene glycol, propylene glycol, diethylene glycol, triethylene glycol, glycerine, trimethylolpropane or the like; unsaturated polyesters produced by the reaction of three kinds of compounds, namely the above-mentioned unsaturated dibasic acid or acid anhydride thereof, a saturated polybasic acid such as succinic acid, adipic acid, phthalic acid, isophthalic acid, phthalic anhydride, trimellitic acid or the like and the above-mentioned polyhydric alcohol; and unsaturated polyesters produced by the reaction of the above-mentioned unsaturated dibasic acid and a compound having two epoxy groups such as digrycidyl ether of bisphenol A. As the unsaturated polyurethane, there may be mentioned unsaturated polyurethanes produced by reacting a polyisocyanate with a polyol having at least two terminal hydroxyl groups to obtain a polyurethane having terminal isocyanate groups or hydroxyl groups and then incorporating at least one addition polymerizable unsaturated group utilizing the reactivity of the terminal isocyanate groups or hydroxyl groups. In practicing the above-mentioned reaction, as the polyisocyanate, there may be used toluylene diisocyanate, diphenylmethane- 4,4'-diisocyanate or hexamethylene diisocyanate and as the polyol, there may be used the above-mentioned polyhydric alcohol, a polyester polyol, a polyether polyol, 1,4-polybutadiene having terminal hydroxyl groups, 1,2-polybutadien having terminal hydroxyl groups, hydrogenated 1,2-polybutadiene having terminal hydroxyl groups, a butadiene-styrene copolymer having terminal hydroxyl groups or a butadiene-acrylonitrile copolymer having terminal hydroxyl groups. After completion of the above-mentioned reaction, at least one addition polymerizable unsaturated group is introduced. The introduction of such an unsaturated group may be carried out by the reaction of an isocyanate with a compound having an active hydrogen, namely a compound having a hydroxyl group, carboxyl group, amino group or the like among the above-mentioned unsaturated carboxylic acids and esters thereof, and (meth)acrylic acids and esters thereof. The introduction of such an unsaturated group may also be carried out by the reaction of a hydroxyl group with a compound having a carboxyl group among the above-mentioned unsaturated carboxylic acid and esters thereof, and (meth)acrylic acids and esters thereof. Further, as the unsaturated polyurethanes, there may be mentioned a compound produced by linking the above-mentioned polyester with a polyisocyanate.

The above-mentioned prepolymers are described in Japanese Patent Application Publications Nos. 51-37320, 52-7761, 52-36444, 52-7363 and 55-34930. Further, the prepolymers described in Japanese Patent Application Laid-open Specification No. 56-120718 and Japanese Patent Application Publication No. 48-43126 may also be used in the present invention.

As the unsaturated polyamide to be used as the ethylenically unsaturated prepolymer, there may be mentioned unsaturated polyamides and N-substituted unsaturated polyamides. The unsaturated polyamides can be produced by the condensation polymerization of a diamine, an unsaturated dicarboxylic acid and a saturated dicarboxylic acid. As the diamine, there may be mentioned ethylenediamine, hexamethylenediamine, dodecamethylenediamine, m-xylenediamine, p-xylylenediamine, 1,4-bisdiaminomethyl cyclohexane and the like. As the unsaturated dicarboxylic acid, there may be mentioned maleic acid, fumaric acid, itaconic acid and the like. As the saturated dicarboxylic acid, there may be mentioned succinic acid, adipic acid, phthalic acid, isophthalic acid, phthalic anhydride, trimellitic acid and the like. The above-mentioned N-substituted unsaturated polyamides which may also be used as the prepolymer can be produced by reacting, in the presence of a catalyst, allyl alcohol or β-methylallyl alcohol, formaldehyde and a polyamide. The polyamide to be used in this reaction can be produced by the condensation polymerization of cyclic caprolactams such as ε-caprolactam, ω-dodecanolactam and the like, the condensation polymerization of ω-amino acids or the condensation polymerization of the above-mentioned saturated dicarboxylic acid and the diamine.

As the unsaturated polymethacrylate to be used as the ethylenically unsaturated prepolymer, there may be mentioned unsaturated polymethacrylates which are produced by reacting methacrylic acid with the glycidyl group of a terpolymer of methyl methacrylate, acrylonitrile and glycidyl methacrylate or by the condensation reaction of the carboxyl group of a copolymer containing methacrylic acid with the hydroxyl group of hydroxyalkyl methacrylate.

As the unsaturated polyimide to be used as the ethylenically unsaturated prepolymer, there may be mentioned unsaturated polyimides which are produced by the condensation reaction of aromatic tetracarboxylic acid (such as pyromellitic acid or biphenyl-4,4',5,5'-tetracarboxylic acid) with (meth)acrylamide-substituted diaminobenzene or (meth)acrylamide-substituted p,p'-diaminobiphenyl ether.

The number average molecular weight of the prepolymer to be used in the present invention is not critical but generally is 500 or more. When a prepolymer has too high a number average molecular weight, the photosensitive resin composition containing such prepolymer is difficult to be dissolved or dispersed in a developer, so that a clear photocured pattern structure cannot be formed. Therefore, with respect to the upper limit of the number average molecular weight, the prepolymer to be used in the present invention has preferably such a number average molecular weight that the photosensitive resin composition containing the prepolymer is easily dissolved or dispersed in a developer.

Generally, when the number average molecular weight per double bond of the prepolymer is 1,000 or more, the surface tack of a photocured pattern structure is likely to become high. When the number average molecular weight per double bond of the prepolymer is 5,000 or more, the surface tack of a photocured pattern structure is very high. In the case of an unsaturated urethane prepolymer having double bonds at both ends, the double bonds are distant from each other. In this case, the surface tack is further increased. The more prepolymer there is which causes the photocured pattern structure to have a high surface tack, the greater is the effect of the present invention. The upper limit of number average molecular weight per double bond of the prepolymer is almost the same as the number average molecular weight of the prepolymer.

The number average molecular weight of the prepolymer to be used in the present invention is generally determined by gel permeation chromatography (GPC) or by calculation using the acid value of the prepolymer.

Generally known kinds of ethylenically unsaturated monomers may be employed in the present invention. As the suitable ethylenically unsaturated monomer, there may be mentioned, for example, ethylenically unsaturated carboxylic acids such as acrylic acid and methacrylic acid; esters of such unsaturated carboxylic acids, such as alkyl(meth)acrylate, cycloalkyl(meth)acrylate, halogenated alkyl(meth)acrylate, alkoxyalkyl(meth)acrylate, hydroxyalkyl(meth)acrylate, aminoalkyl (meth)acrylate, tetrahydrofurfuryl(meth)acrylate, allyl(meth)acrylate, glycidyl(meth)acrylate, benzyl(meth)acrylate, phenoxy(meth)acrylate, alkylene glycol mono(meth)acrylate, alkylene glycol di(meth)acrylate, polyoxyalkylene glycol mono(meth)acrylate, polyoxyalkylene glycol di(meth)acrylate, trimethylolpropane tri(meth)acrylate and pentaerythritol tetra(meth)acrylate; acrylamide, methacrylamide and derivatives thereof such as N-alkyl(meth)acrylamide, N-hydroxyalkyl(meth)acrylamide, N,N-dialkyl(meth)acrylamide, N,N-dihydroxyalkyl(meth)acrylamide, diacetone(meth)acrylamide and N,N'-alkylenebis(meth)acrylamide; allyl compounds such as allyl alcohol, allyl isocyanate, diallyl phthalate and triallyl cyanurate; maleic acid, maleic anhydride, fumaric acid and esters thereof such as monoalkyl maleate or fumarate, dialkyl maleate or fumarate, mono(halogenated alkyl)maleate or fumarate, di(halogenated alkyl)maleate or fumarate, mono(alkoxyalkyl)maleate or fumarate and di(alkoxyalkyl)maleate or fumarate; and other ethylenically unsaturated compounds such as styrene, vinyltoluene, divinylbenzene, N-vinylcarbazole, N-vinylpyrrolidone and the like. In combination with the above-mentioned ethylenically unsaturated monomer, an azide compound may be employed in the present invention.

The weight ratio of the above-mentioned monomer or the above-mentioned monomer plus the above-mentioned azide compound to the ethylenically unsaturated prepolymer may be 0/100 to 100/0, both exclusive.

Various known photoinitiators generally employed in photocure reactions may be incorporated into the photocurable resin composition of the present invention. As a suitable photoinitiator, there may be mentioned, for example, benzoin, benzoin alkyl ethers such as benzoin ethyl ether, benzoin n-propyl ether, benzoin isopropyl ether and benzoin isobutyl ether, and other compounds such as dimethoxyphenylacetophenone, benzophenone and thioxanthone.

The weight ratio of the photoinitiator to the ethylenically unsaturated prepolymer and the ethylenically unsaturated monomer is 0.001/100 to 10/100.

As the stabilizer to be used according to need, there may be mentioned, for example, hydroquinone, mono-tert-butyl hydroquinone, benzoquinone, 2,5-diphenyl-p-benzoquinone, picric acid, di-p-fluorophenylamine, p-methoxyphenol, 2,6di-tert-butyl-p-cresol. The stabilizer to be used in the present invention may preferably be those which do not inhibit photochemical reaction but heat polymerization (or dark reaction) only. From the viewpoint of non-inhibition of the photochemical reaction, the weight ratio of the stabilizer to the ethylenically unsaturated prepolymer plus the ethylenically unsaturated monomer is 0.005/100 to 5.0/100.

With respect to the composition comprising a binder polymer, ethylenically unsaturated monomer and photoinitiator, an illustrative explanation will be given below.

As the binder polymer, there may be mentioned polyvinyl alcohol, polyamide and various kinds of rubber compounds. As examples of the ethylenically unsaturated monomer and the photoinitiator, the same examples as described above may be mentioned.

The weight ratio of the binder polymer to the ethylenically unsaturated monomer may be 99/1, inclusive, to 0/100, exclusive. The weight ratio of the photoinitiator to the binder polymer plus ethylenically unsaturated monomer is 0.001/100 to 10/100.

A stabilizer of which the examples are mentioned above may also be incorporated in the composition at a weight ratio of the stabilizer to the binder polymer plus the ethylenically unsaturated monomer of 0.005/100 to 5.0/100.

The number average molecular weight (as measured according to GPC) of the binder polymer to be used in the present invention is not critical but is generally 20,000 or more. With respect to the upper limit of number average molecular weight of the binder polymer, the same explanation as described with respect to the prepolymer may apply.

The compound (I) to be employed in the present invention is represented by the formula $$R^1—X \qquad (I)$$

wherein $R^1$ represents a monovalent hydrocarbon residue represented by $C_nH_{2n+1}$ or $C_nH_{2n-1}$ in which n is an integer of from 11 to 21; and X represents —COOH, —CONH$_2$ or —CH$_2$OR$^2$ in which $R^2$ represents H or —CO—R$^3$—S—R$^3$—COOCH$_2$—R$^4$ in which $R^3$ is a divalent hydrocarbon residue having 1 to 6 carbon atoms and $R^4$ has the same meaning as $R^1$.

With respect to the compound (I) to be employed in the present invention, it is preferred that a suitable compound be selected according to the kind of the photocurable resin composition, taking into consideration the solubility of the compound (I) in the composition and the effect of the amount of addition of the compound (I) on the surface tack removal. A compound having a decreased number of carbon atoms tends to exhibit an increased solubility in the photocurable resin composition but a decreased surface tack removal effect. On the other hand, a compound having an increased number of carbon atoms tends to exhibit an increased surface tack removal effect but tends to cause the composition to cloud to thereby decrease the image reproducibility of the composition. To attain an optimum solublity and surface tack removal effect, it is preferred that the number of carbon atoms of $R^1$ of the above formula be in the range of from 11 to 21. Especially, compounds of the formula (I) having a group X selected from the class consisting of a hydroxyl group, a carboxyl group, an amido group and a thiodiester group of the formula wherein $R^1$ and $R^3$ are as defined above are preferred because their ability to remove surface tack is excellent. More preferably, compounds of formula (I) wherein $R^1$ has 13 to 17 carbon atoms when X represents a hydroxyl group or a carboxyl group; $R^1$ is a saturated hydrocarbon residue having 13 carbon atoms or an ethylenically unsaturated hydrocarbon residue of the formula $C_{17}H_{33}$ when X represents an amido group; and $R^1$ has 11 to 17 carbon atoms and $R^3$ has 3 carbon atoms when X represents a thiodiester group can be advantageously utilized because they are excellent in surface tack removal effects and exhibit a high solubility in the photocurable resin composition. The above-mentioned compounds of formula (I) may be used alone or in mixtures together.

Specific examples of the compound (I) are lauryl alcohol, myristyl alcohol, cetyl alcohol, stearyl alcohol, eicosyl alcohol, lauric acid, myristic acid, palmitic acid, stearic acid, eicosanic acid, lauramide, myristamide, palmitamide, stearamide, eicosanamide, dilauryl thiodipropionate, dimyristyl thiodipropionate, distearyl thiodipropionate, oleyl alcohol, erucyl alcohol, oleic acid, erucic acid, oleamide, erucamide, tetradecenoic acid and behenic acid.

The compound (I) may be added to the photocurable resin composition alone or in combination. The amount of the compound (I) to be added in the present invention is not critical. The preferable weight ratio of the compound (I) to the photocurable resin composition varies according to the kind of the photocurable resin composition because the solubility of the compound (I) in the photocurable resin composition varies depending on kind of the composition. In general, however, it is noted that when the weight ratio of the compound (I) to the photocurable resin composition is 0.1/100 or more, the high surface tack-removing effect can be attained.

On the other hand, when the weight ratio of the compound (I) to the photocurable resin composition is 6/100 or less, the resultant composition has an excellent clarity [the compound (I) is dissolved in the photocurable resin composition.], causing the image reproducibility of the composition to be high. Moreover, such a weight ratio of the compound (I) to the photocurable resin composition is advantageous because it causes the mechanical strength of the ultimate cured product to be high. Therefore, it is generally preferred that the weight ratio of the compound (I) to the photocurable resin composition be 0.1/100 to 6/100. Further, from the viewpoints of surface tack removal effect and mechanical strength of the ultimate cured product, it is especially preferred that the weight ratio of the compound (I) to the photocurable resin composition be 0.5/100 to 4/100.

The method of incorporating the compound (I) into the photocurable resin composition is not critical. That is, the compound (I) may be incorporated into the composition in various methods without any adverse affect on the present invention. For example, in the case of the photocurable resin composition comprising an ethylenically unsaturated prepolymer, ethylenically unsaturated monomer and photoinitiator, the compound (I) may be incorporated into the composition by a method which includes first adding the compound (I) to the ethylenically unsaturated prepolymer to prepare a preliminary composition and subsequently blending the preliminary composition with the ethylenically unsaturated monomer, photoinitiator and any other employable component to prepare the target composition; a method which includes first mixing the compound (I) with the ethylenically unsaturated monomer to prepare a preliminary composition and subsequently blending the preliminary composition with the ethylenically unsaturated prepolymer, photoinitiator and any other employable component to prepare the intended composition; or a method which includes blending the compound (I) with the photocurable resin composition consisting of the ethylenically unsaturated prepolymer, ethylenically unsaturated monomer, photoinitiator and any other materials to prepare the intended composition. The incorporation of the compound (I) into the photocurable resin composition may generally be performed at a temperature of about 40° to 100° C.

The compounds (I) are exemplified above are commercially available. Generally, the compound (I) can be easily synthesized as follows:

(i) In the case of $C_nH_{2n-1}X$ (unsaturated carboxylic acids, unsaturated amides and unsaturated alcohols):

A saturated carboxylic acid, for example, $C_{14}H_{29}COOH$ is reduced to $C_{14}H_{29}COH$ (aldehyde) according to an ordinary method. The obtained aldehyde is subjected to a condensation reaction with malonic acid (Knoevenagel reaction), followed by decarboxylation to prepare $C_{16}H_{31}COOH$ (unsaturated carboxylic acid). In this way, any desired unsaturated carboxylic acid having a predetermined number of carbon atoms can be obtained.

With respect to the unsaturated amides, according to the ordinary method, they can be easily derived from the carboxylic acids which are synthesized in the above manner.

With respect to the unsaturated alcohols, they can be synthesized be selectively reducing the above-obtained carboxylic acids using LiAlH$_4$ (lithium aluminum hydride).

(ii) In the case of $C_nH_{2n+1}X$ (saturated carboxylic acids, saturated amides and saturated alcohols):

When the unsaturated carboxylic acids which are obtained in the above-mentioned manner are hydrogenated in the presence of a catalyst, there can be obtained the desired saturated carboxylic acids.

With respect to the saturated amides and saturated alcohols, they can be synthesized in the same manner as described with respect to the case of $C_nH_{2n-1}X$.

(iii) In the case of thiodiesters:

A starting compound, $R^5$—S—$R^5$ (in which $R^5$ stands for a carboxylic acid residue having 2 to 7 carbon atoms) is reacted with an aliphatic alcohol to prepare a thiodiester according to the ordinary method. With respect to the starting compounds $R^5$—S—$R^5$ in which $R^5$ is a carboxylic acid residue having 2 to 3 carbon atoms, they are commercially available. With respect to the starting compound $R^5$—S—$R^5$ in which $R^5$ is a carboxylic acid residue having 4 to 7 carbon atoms, they can be synthesized in the method disclosed in Acta Chim. Acad. Sci. Hung. 34, 87–91(1962).

The compounds (I) can also be synthesized according to methods other than the above-mentioned methods. For example, they can be prepared in the methods as disclosed in the following published literature.

| [Literature] | |
|---|---|
| In the case of $C_nH_{2n+1}$—X: | |
| (1) n = 12 | |
| X=CH$_2$OH | Armstrong, M. D. et al, JACS, 65, 2252 (1943) |
| X=COOH | Organic Synth. 16, 35 (1936) |
| (2) n = 14 | |
| X=CH$_2$OH | Ruhoff, J. R. et al, JACS, 55, 3825 (1933) |
| X=COOH | Wyrberg, H. et al, JACS, 78, 1958 (1956) |
| (3) n = 16 | |
| X=CH$_2$OH | Watanabe A, Bull. Chem. Soc. Jpn., 32, 1295 (1954) |
| X=COOH | Buchta, E. et al, Justus Liebigs Ann. Chem., 698, 93 (1966) |
| (4) n = 18 | |
| X=COOH | Oskerk. A., Chem. Zntralbl., 2, 1264 (1914) |
| X=CH$_2$OH | Levene, P. A., J. Biol. Chem., 59, 905 (1924) |
| In the case of $C_nH_{2n-1}X$: | |
| (1) n = 14 | |
| X=CH$_2$OH | Luning B. et al, Acta Chem. Scand 21, 829 (1967) (14-pentadecene-1-ol) |
| (2) n = 9-16 | |
| X=COOH, CH$_2$OH | "Zh. Org. Khim" 10(4), 696-700(1974) |
| (3) n = 18 | |
| X=COOH | Pierre Savary, Bull. Soc. Chim. France, pp. 624–627(1950) |
| ($C_nH_{2n-1}CH_2OH$ can be prepared by reducing $C_nH_{2n-1}COOH$ using AlLiH$_4$.) | |

With respect to the above-mentioned compound (I), the amides thereof may be synthesized using the above compounds in the form of acid according to the ordinary method.

Pattern structures improved with respect to surface tack-free characteristics may be prepared by the various known methods using the photosensitive resin composition of the present invention. For example, first, the photosensitive resin composition of the present invention is applied to the surface of a substrate to form a photosensitive resin layer; second, the resin layer is image-wise exposed to actinic radiation through an image-bearing transparency such as a negative to convert the photosensitive resin layer to a layer having cured image portions and remaining uncured portions; third, the remaining uncured portions are removed to form a pattern structure of photocured resin. Then, post-exposure is performed to increase the mechanical strength.

The application of the photosensitive resin composition onto a substrate may be performed by various known methods such as a coating method using a doctor blade, an injecting method in which a spacer is provided between a metal base film and a glass substrate covered with a cover film to form a cavity and a photosensitive resin is injected into the cavity and a method in which a photosensitive resin composition is subjected to injection molding to form a photosensitive resin plate by means of an injection mold and then sandwiched between a protective film and a base film with an adhesive layer, followed by pressing by a roller. As the substrate, there may generally be employed films or plates having a thickness of 100–200 μm such as polyester films, iron plates and aluminum plates. As the source of the actinic radiation there may be mentioned, for example, a carbon arc lamp, an ultra-high pressure mercury lamp, a high pressure mercury lamp, a low pressure mercury lamp, an ultraviolet fluorescent lamp, a metal halide lamp, a xenon lamp, the sun and the like. The remaining uncured portions not irradiated with actinic radiation may be removed by blowing air, or by treatment with a liquid which is capable of dissolving or dispersing therein the uncured photosensitive resin. As such a liquid, there may be mentioned, for example, water; aqueous acid solutions such as aqueous acetic acid; aqueous alkaline solutions such as aqueous potassium hydroxyde, aqueous sodium carbonate, aqueous sodium borate, aqueous sodium silicate, aqueous diethanolamine; aqueous solutions of surface active agent such as polyoxyethylene type surface active agent, aqueous alkylbenzene sulphonate, aqueous ADS, aqueous alkylammonium chloride; organic solvents such as 1,1,1-trichloroethane, methylene chloride, butoxyethanol, isopropyl alcohol.

The post-exposure may be performed in air or a liquid such as water.

The obtained pattern structure may be used as a decorative material after stripping the substrate or may be used, with the substrate remaining attached, as a letterpress, molding matrix, decorative material and the like. When the pattern structure is used as a letterpress, the substrate should have an adhesive layer.

The photosensitive resin composition of the present invention may preferably be used for preparing a printing plate for letterpress printing, especially for flexography.

In another aspect of the present invention, there is provide a method of preparing a surface-tack free photocured pattern structure which comprises:

(i) applying to the surface of a substrate the photosensitive resin composition comprising: a photocurable resin composition as mentioned previously; and at least one compound (I) represented by the general formula (I)

$$R^1-X \qquad (I)$$

wherein $R^1$ represents a monovalent hydrocarbon residue represented by $C_nH_{2n+1}$ or $C_nH_{2n-1}$ in which n is an integer of from 11 to 21; and X represents —COOH, —CONH$_2$ or —CH$_2$OR$^2$ in which $R^2$ represents H or —CO—R$^3$—S—R$^3$—COOCH$_2$—R$^4$ in which $R^3$ is a divalent hydrocarbon residue having 1 to 6 carbon atoms and $R^4$ has the same meaning as $R^1$, to form a photosensitive resin layer;

(ii) image-wise exposing the photosensitive resin layer to actinic radiation through an image-bearing transparency to convert the photosensitive resin layer to a layer having cured image portions and remaining uncured portions;

(iii) removing the remaining uncured portions to form a pattern structure of photocured resin; and (iv) subjecting the pattern structure to post-exposure to actinic radiation, with the pattern structure immersed in an aqueous solution containing an alkali metal salt or alkaline earth metal salt of sulfurous acid.

According to the above method, a photocured pattern structure which is free from surface tack can be obtained in a stable manner even immediately after the preparation thereof. Therefore, when printing should be carried out using a photocured pattern structure (printing plate) immediately after the preparation thereof, the above method may be advantageously employed.

The application of the photosensitive resin composition, the exposure of the applied resin composition to actinic radiation and the removal of the remaining uncured portions (development) may be performed according to various known methods which are illustratively mentioned above.

As the substrate, there may be employed various known substrates which are illustratively mentioned above.

As the alkali metal salt or alkaline earth metal salt of sulfurous acid to be used in the present invention, there may be metioned, for example, sodium sulfite, potassium sulfite, calcium sulfite and the like.

The alkali metal salt or alkaline earth metal salt of sulfurous acid may preferably be dissolved in water at a concentration of 0.01% by weight or more for post-exposure. When the concentration is 0.01% by weight or more, a high surface tack-removing effect can be attained immediately after the preparation of the pattern structure. The effect of the post-exposure on removal of the surface tack is affected by the kind and content of the compound (I) in the photosensitive resin composition. So, in order to stably obtain photocured products free from surface tack, the concentration of the alkali metal salt or alkaline earth metal salt of the sulfurous acid is more preferably 0.05% by weight or more. The upper limit of the concentration is not critical. Even if the alkali metal salt or alkaline earth metal salt of sulfurous acid is added over the solubility to form a suspension, the removal of the surface tack can be attained by post-exposure using the suspension. The use of such suspensions, however, leads to a decrease in post-exposure efficiency. The post-exposure treatment is also intended to endow the products with other adequate properties and, for this purpose, sufficient radiation is required. Therefore, when a suspension of an alkali metal salt or alkaline earth metal salt is used for post-exposure, prolonged operation time is required. Generally, the upper limit of the concentration of the alkali metal salt or alkaline earth metal salt of sulfurous acid may be determined taking into consideration the foregoing defects and cost. Practically, an aqueous solution containing an alkali metal salt or alkaline earth metal salt of sulfurous acid at a concentration up to a saturation concentration may be used.

The temperature of the aqueous solution containing the alkali metal salt or alkaline earth metal salt of sulfurous acid is not critical but may generally be in the range of from about 10° to 30° C.

As the source of post-exposure to be used in the present invention, there may be mentioned, for example, a carbon arc lamp, an ultra-high pressure mercury lamp, a pressure mercury lamp, an ultraviolet fluorescent lamp, a metal halide lamp, a xenon lamp, a germicidal lamp, the sun and the like.

The irradiation time and the irradiation intensity for post-exposure are the same as in the case of the ordinary post-exposure which is effected for providing the products adequate properties. Generally, the irradiation intensity is in the range of several hundreds to 1,000 mJ/cm$^2$. The irradiation time is, in the case of ultraviolet lamp, about 5 to 15 minutes.

In the post-exposure, the distance between the surface of the pattern structure and the surface of an aqueous solution containing an alkali metal salt or alkaline earth metal salt of sulfurous acid is not critical and may be chosen according to the post-exposure conditions such as irradiation time, irradiation intensity and the like.

After the post-exposure, drying may be effected in accordance with the ordinary method. In the present invention, for example, drying may be effected by blowing heated air (about 60° C.) for 10 to 15 minutes.

According to the present method of preparing a photocured pattern structure, there can be stably prepared a photocured pattern structure which is free from surface tack even immediately after the preparation thereof.

The improvement of the surface tack-free characteristic can be evaluated by the value of surface tack (in terms of g) which is determined according to the later-mentioned method. If the surface tack obtained according to the later-mentioned measurement is more than 50 g, problems are caused. That is, if, for example in handling, such a product has once been placed on another product so that the tacky resin faces of both the products meet together, it becomes difficult to separate from each other. Moreover, if the products having a surface tack of more than 50 g have once been piled and stored, adhesion of the tacky surfaces of the relief images to the substrates such as various films, foils and plates is inevitably caused, so that the separation from each other also becomes difficult. Hence, it is desired that the photocured product have a surface tack as small as 50 g or less. When a photocured product having a high surface tack is employed as a printing plate, adhesion of paper dusts to the printing plate is caused, making the printed articles dirty. Moreover, when the material to be printed is paper, peeling of paper is caused by the adhesion of the printing plate to the paper. From the viewpoint of preventing these problems, the surface tack of the photocured products for printing plates should be as small as possible, preferably 30 g or less.

From the usual photosensitive resin compositions, there are usually obtained photocured products having a surface tack of 100 g or more. While, from photosensitive resin compositions especially intended to yield a low hardness, there are usually obtained photocured products having a surface tack as high as more than 300 g.

However, by the use of a photosensitive resin composition containing the compound (I), it has been possible to obtain photocured products having a surface tack as small as 30 g or less after several hours from the preparation thereof even by an ordinary photocuring method.

Moreover, when the post-exposure has been conducted using an aqueous solution containing an alkali metal salt or alkaline earth metal salt of sulfurous acid, the photocured products obtained from a photosensitive resin composition containing the compound (I) indicate no surface tack even just after the preparation thereof.

This invention will now be described in detail with reference to the following Examples and Comparative Examples in which all of "parts" are given on a weight basis unless otherwise indicated and which should not be construed to limit the scope of the present invention.

In the following Examples and Comparative Examples, the surface tack, tensile strength, tensile elongation and number average molecular weight of prepolymers were measured in accordance with the following methods.

(1) Measurement of surface tack:
A specimen was prepared as follows.
A negative having a transparent portion (10 cm × 10 cm) was placed on a lower glass plate of APR exposure equipment AF 210E (trade name of an apparatus sold by Asahi Chemical Ind. Co., Ltd., Japan) and the negative was covered with a square-shaped cover film of CF 42 (trade name of a film manufactured and sold by Asahi Chemical Ind. Co., Ltd.). Two pairs of square-shaped spacers having a thickness of 3 mm were placed on the cover film so that the spacers of each pair are positioned in an opposite relationship through a common square-shaped spacing (to become a cavity) formed therebetween, thereby to form a cavity. A photosensitive resin composition was poured to form a photosensitive resin layer and the layer was covered with BF 173 (trade name of a polyester film with an adhesive layer manufactured and sold by Asahi Chemical Ind. Co., Ltd., Japan). The polyester film was pressed with an upper glass plate. Then, exposure was effected for 30 seconds from the side of the polyester film and for 5 minutes from the side of the negative using Chemical Lamp FLR 20S.B-DU-37C/M (trade name of a chemical lamp manufactured and sold by Toshiba Corporation, Japan) having a central wavelength of 370 nm. Then, development, post exposure and drying were carried out according to the procedures described in each Example and Comparative Example to prepare a specimen having a thickness of 3 mm.

The surface tack of the specimen was measured at 20° C.

Turning now to the drawing, there is shown a schematic diagram of an apparatus for determining the surface tack of a photocured pattern structure. The specimen 1 thus prepared was attached to a level support 2 in such a manner that the resin face of the specimen was directed upward. An aluminum wheel 3 of 13 mm in width and 50 cm in diameter was brought into contact with the plane portion of the resin face of the specimen. A load of 500 g was applied to the aluminum wheel and allowed to stand for 4 seconds. Then, the wheel was lifted upward at a constant elevation speed of 30 mm/min until the specimen was separated from the wheel. The value of the stress just before the separation of the wheel 3 from the specimen 1 was measured using PICMA Tack Tester Model No. 235 (trade name of an apparatus manufactured and sold by Toyo Seiki Seisaku-sho, Ltd., Japan). The value of the surface tack is expressed in terms of the value of the stress as measured above.

(2) Measurement of tensile strength and tensile elongation:

A specimen was prepared as follows: Two pairs of square-shaped spacers having a thickness of 1 mm were arranged on a glass plate with a cover film so that the spacers of each pair are positioned in an opposite relationship through a common square-shaped spacing (to become a cavity) formed therebetween, thereby to form a cavity. A photosensitive resin composition was charged in the cavity. Then, the cavity charged with the composition was covered with another glass plate with a cover film and the charged composition was exposed for 10 minutes at an irradiation intensity of 1 mW/cm$^2$ from both the glass plate sides to actinic radiation emitted from Chemical Lamp FLR 20S.B-DU-37C/M (trade name of a chemical lamp manufactured and sold by Toshiba Corporation, Japan) having a central wavelength of 370 nm to obtain a photocured sheet. The obtained photocured sheet was die-cut to obtain a dumbbell specimen of 30 mm in distance between gages, 3 mm in width of parallel portion and 1 mm in thickness.

Using the above-obtained specimen, tensile strength and tensile elongation were determined in accordance with the method of JIS K-6301 (Japanese Industrial Standards K-6301).

(3) Number average molecular weight of prepolymers:

The number average molecular weight of prepolymers was determined by gel permeation chromatography under the following conditions unless otherwise indicated.

Column: Shodex 803+Shodex 804 (trade name of a column manufactured and sold by Showa Denko K.K., Japan)
Eluent: chloroform
Flow rate: 1 ml/min
Standard Material: polystyrene

EXAMPLE 1

One part of polypropylene glycol [number average molecular weight (hereinafter often referred to as "$\overline{M}n$")=2,000] and one part of poly propylene glycol adipate diol ($\overline{M}n$=2,000) were mixed with 0.2 part of toluylene diisocyanate, and they were reacted at 80° C. for 3 hours to obtain a polyurethane having at its ends isocyanate groups. 2.2 Parts of the obtained polyurethane were reacted with 0.47 part of polypropylene glycol monomethacrylate ($\overline{M}n$=380) at 80° C. for 2 hours to obtain a modified polyurethane prepolymer having at its ends methacrylate groups {$\overline{M}n\approx22,000$[$\overline{M}n$ (calculated)=16,500}.

100 parts of the thus obtained prepolymer were mixed with 25 parts of polypropylene glycol monomethacrylate ($\overline{M}n$=380), 15 parts of laurylmethacrylate, 10 parts of tetraethylene glycol dimethacrylate, 1.5 parts of 2,2-dimethoxy-2-phenyl acetophenone and 0.2 part of 2,6-di-tert-butyl-p-cresol to prepare a photocurable resin composition [Photocurable Resin Composition (a)]. To the Photopocurable Resin Composition (a) were added 2 parts of myristic acid as Compound (I) and mixed at 50° C. to prepare a photosensitive resin composition [Photosensitive Resin Composition (A)].

In the same manner as described before with respect to the measurement of surface tack, two pairs of square-shaped spacers were placed on polypropylene film as a cover film. The above Photosensitive Resin Composition (A) was poured into the cavity formed by the spacers and the polypropylene film. Then, the cavity filled with the Photosensitive Resin Composition (A) was covered with a 100 μm-thick polyester film as a substrate to obtain a laminate sheet. The laminate sheet was exposed for 5 minutes from the side of the polypropylene film as the cover film through a negative to actinic radiation emitted from Chemical Lamp FLR 20S.B-DU-37C/M (trade name of a chemical lamp manufactured and sold by Toshiba Corporation, Japan) having a central wavelength of 370 nm and placed at a distance of about 10 cm from the surface of the laminate sheet, followed by stripping the cover film. Then, the so obtained sheet was developed with an aqueous solution of a nonionic surface active agent [a 2 wt % aqueous solution of Wash Out Agent W-7 (trade name of a nonionic surface active agent sold by Asahi Chemical Ind. Co., Ltd., Japan)] as a developer at 40° C., followed by the removal of the used developer with running water to prepare a relief-imaged plate. The thus obtained plate was immersed in water (25° C.) with the relief-imaged side kept up so that the distance between the surface of the plate and the surface of the water was about 7 mm. Then, the plate in the water was exposed (post-exposure) for 15 minutes to actinic radiation emitted from the above-mentioned chemical lamp placed at a distance of about 14 cm from the surface of the plate to obtain a photocured relief-imaged plate (photocured pattern structure). The obtained plate was dried in a current of heated air (60° C.) for 15 minutes using Dryer & Postexposure Equipment Model AL-100P (trade name of an apparatus sold by Asahi Chemical Ind. Co., Ltd., Japan). After the thus obtained photocured relief-imaged plate was allowed to stand for 3 hours in air of relative humidity of about 70% at 20° C., the surface tack of the photocured relief-imaged plate was determined to be 0 (zero) g.

EXAMPLE 2

A liquid mixture composed of 43 parts of diethylene glycol, 14 parts of fumaric acid, 12 parts of itaconic acid and 28 parts of adipic acid was subjected to an esterification reaction at 220° C. for 9 hours to obtain an unsaturated ester prepolymer having a number average molecular weight of 2,300 (determined by calculation using the acid value of the prepolymer). To 100 parts of the so obtained prepolymer were added 30 parts of 2-hydroxypropyl methacrylate, 2 parts of tetraethylene glycol dimethacrylate, 8 parts of a methacrylic acid diester of polypropylene glycol ($\overline{M}n$=400), 4 parts of benzoin isopropyl ether and 0.2 part of 2,6-di-tert-butyl-p-cresol to prepare a photocurable resin composition [Photocurable Resin Composition (b)]. To the Photocurable Resin Composion (b) was added 4.2 parts of cetyl alcohol as Compound (I) and mixed at 50° C. to prepare a photosensitive resin composition [Photosensitive Resin Composition (B)].

Substantially the same procedures as in Example 1 were repeated to prepare a relief-imaged plate except that the above-obtained Photosensitive Resin Composition (B) was used instead of Photosensitive Resin Composition (A) and that a 1 wt % aqueous sodium carbonate solution (40° C.) was used as a developer instead of an aqueous solution of a nonionic surface active agent. The thus obtained plate was exposed for 10 minutes in air to the chemical lamp employed in Example 1 which was placed at a distance of about 5 cm from the surface of the plate to obtain a photocured relief-imaged plate.

After the thus obtained photocured relief-imaged plate was allowed to stand for 3 hours in air of relative humidity of about 70% at 20° C., the surface tack of the photocured relief-imaged plate was determined to be 0 g.

EXAMPLE 3

300 Parts of a hydroxyl group-terminated hydrogenated 1,2-polybutadiene having 1.6 hydroxyl groups on the average in one molecule ($\overline{Mn}$=3,000; hydrogenation degree=95%) were mixed with 17.4 parts of tolylene diisocyanate, and they were reacted at 60° C. for 3 hours with stirring. Then, a liquid mixture composed of 8.6 parts of 2-hydroxypropyl methacrylate, 0.1 part of hydroquinone and 0.1 part of dibutyltin dilaurate was added to the reaction mixture, and the reaction was conducted in a dry air atmosphere at 80° C. until a characteristic absorption of NCO ($\lambda$=around 2,260 cm$^{-1}$) was not substantially observed on an infrared absorption spectrum chart, to prepare a prepolymer having a number average molecular weight $\overline{Mn}$ of 13,000 (calculated). To 100 parts of the so obtained prepolymer were added 40 parts of lauryl methacrylate, 10 parts of a methacrylic acid diester of polypropylene glycol having a number average molecular weight $\overline{Mn}$ of 400, 3 parts of benzoin amyl ether, and 0.1 part of p-methoxy phenol to prepare a photocurable resin composition [Photocurable Resin Composition (c)]. To the Photocurable Resin Composition (c) was added 4.5 parts of palmitic acid as Compound (I) at 50° C. to prepare a photosensitive resin composition [Photosensitive Resin Composition (C)].

Substantially the same procedures as in Example 1 were repeated to prepare a relief-imaged plate, except that the above-obtained Photosensitive Resin Composition (C) was used instead of Photosensitive Resin Composition (A). The thus obtained plate was immersed in water (25° C.) and irradiated in the water from the relief-imaged side of the plate for 10 minutes with two kinds of actinic radiations, namely, actinic radiation emitted from the same chemical lamp as used in Example 1 and actinic radiation (central wavelength: 254 nm) emitted from Toshiba Germicidal Lamp GL-15 (trade name of a germicidal lamp manufactured and sold by Toshiba Corporation, Japan), both of which lamps were placed at a distance of about 15 cm from the relief surface of the plate. In that instance, the irradiation with the chemical lamp was effected simultaneously with the irradiation with the germicidal lamp, and the distance between the relief surface and the surface of the water was several millimeters to 10 millimeters. The thus obtained product was dried in a current of heated air (60° C.) for 15 minutes using Dryer & Postexposure Equipment Model AL-100P (trade name of an apparatus sold by Asahi Chemical Ind. Co., Ltd., Japan) and then allowed to stand at 20° C. for 3 hours to obtain a photocured relief-imaged plate. Then, the surface tack of the photocured relief-imaged plate was determined to be 20 g.

COMPARATIVE EXAMPLE 1

Substantially the same procedures as in Example 1 were repeated to prepare a photocured relief-imaged plate, except that the addition of Compound (I) (2 parts of myristic acid) to Photocurable Resin Composition (a) was omitted. The surface tack of the resulting photocured relief-imaged plate was as shown in Table 1 given below.

COMPARATIVE EXAMPLE 2

Substantially the same procedures as in Example 2 were repeated to prepare a photocured relief-imaged plate, except that the addition of Compound (I) (4.2 parts of cetyl alcohol) to Photocurable Resin Composition (b) was omitted. The surface tack of the resulting photocured relief-imaged plate was as shown in Table 1 given below.

COMPARATIVE EXAMPLE 3

Substantially the same procedures as in Example 3 were repeated to prepare a photocured relief-imaged plate, except that the addition of Compound (I) (4.5 parts of palmitic acid) to Photocurable Resin Composition (c) was omitted. The surface tack of the resulting photocured relief-imaged plate was as shown in Table 1 given below.

EXAMPLES 4 TO 10

Substantially the same procedures as in Example 1 were repeated to prepare photocured relief-imaged plates, except that compounds as indicated in Table 1 given below were used as Compound (I) instead of 2 parts of myristic acid and that with respect to Example 6 the post-exposure was effected in the same manner as in Example 3. The surface tacks of the resulting photocured relief-imaged plates were as shown in Table 1 given below.

TABLE 1

| | Photosensitive resin composition | | | | Surface tack of photocured relief-imaged plate (g) |
|---|---|---|---|---|---|
| | Photo-curable resin composition | | Compound (I) | | |
| | Kind | Amount (parts) | Kind | Amount (parts) | |
| Comparative Example 1 | (a) | 100 | None | 0 | 500 |
| Comparative Example 2 | (b) | 100 | " | 0 | 150 |
| Comparative Example 3 | (c) | 100 | " | 0 | 400 |
| Example 4 | (a) | 100 | Dimyristyl thio-dipropionate | 3 | 0 |
| Example 5 | (a) | 100 | Oleic amide | 1 | 0 |
| | | | Dilauryl thio-dipropionate | 0.5 | |
| Example 6 | (a) | 100 | Erucic amide | 1.5 | 10 |
| Example 7 | (a) | 100 | Dilauryl thio-dipropionate | 1.8 | 0 |
| Example 8 | (a) | 100 | Palmitic acid amide | 3 | 0 |
| Example 9 | (a) | 100 | Stearic acid amide | 1.5 | 0 |
| Example 10 | (a) | 100 | Eicosanic acid | 3 | 10 |

EXAMPLES 11 TO 16

Substantially the same procedures as in Example 1 were repeated to prepare photocured relief-imaged plates, except that the compounds as shown in Table 2 were used as Compound (I) in an amount as shown in Table 2 instead of 2 parts of myristic acid. The surface tacks of the photocured relief-imaged plates thus obtained were determined and the results are shown in Table 2.

TABLE 2

| Example | Compound (I) Kind | Compound (I) Amount (part)* | Clarity of photosensitive resin composition (at 20° C.) | Photocured relief-imaged plate Tensile strength (Kg/cm²) | Photocured relief-imaged plate Tensile elongation (%) | Photocured relief-imaged plate Surface tack (g) |
| --- | --- | --- | --- | --- | --- | --- |
| Example 11 | Cetyl alcohol | 2 | Excellent | 100 | 340 | 30 |
| Example 12 | " | 4 | " | 70 | 200 | 0 |
| Example 13 | Dimyristyl thiodipropionate | 0.5 | " | 110 | 330 | 30 |
| Example 14 | Dimyristyl thiodipropionate | 1.0 | " | 100 | 330 | 0 |
| Example 15 | Dimyristyl thiodipropionate | 3.0 | " | 80 | 220 | 0 |
| Example 16 | Myristic acid | 6.0 | " | 80 | 250 | 0 |

Note:
*Amount (part) based on 100 parts of Photopolymerizable Resin Composition (a).

EXAMPLE 17

Substantially the same procedures as in Example 1 were repeated to prepare a photocured relief-imaged plate, except that the post-exposure was effected in a 0.1 wt % aqueous solution of sodium sulfite instead of water. The resulting photocured relief-imaged plate was dried in a current of heated air (60° C.) for 15 minutes using Dryer & Postexposure Equipment Model AL-100P (trade name of an apparatus sold by Asahi Chemical Ind. Co., Ltd., Japan). Immediately after completion of the drying, the surface tack of the photocured relief-imaged plate was determined to be 0 (zero) g.

EXAMPLE 18

Substantially the same procedures as in Example 17 were repeated to prepare a photocured relief-imaged plate, except that erucic amide was used as Compound (I) instead of myristic acid. Immediately after completion of the drying (60° C., 15 minutes), the surface tack of the photocured relief-imaged plate was determined to be 0 (zero) g.

EXAMPLES 19 to 24

Six relief-imaged plates were prepared in the same manner as in Example 1. The thus prepared relief-imaged plates were immersed in aqueous solutions of sodium sulfite having various concentrations shown in Table 3 given below. Toshiba Chemical Lamp FLR 20S.B-Du-37 c/M (trade name of a chemical lamp manufactured and sold by Toshiba Corporation, Japan) and Toshiba Germicidal Lamp GL-15 (trade name of a germicidal lamp manufactured and sold by Toshiba Corporation, Japan) were each placed at a distance of about 15 cm from the relief surfaces of the relief-imaged plates. The relief-imaged plates were irradiated in the aqueous sodium sulfites from the relief sides for about 10 minutes with two kinds of actinic radiation (central wavelength: chemical lamp, 370 nm; germicidal lamp, 254 nm) emitted from the above-mentioned two lamps. In that instance, the irradiation with the chemical lamp was effected simultaneously with the irradiation with the germicidal lamp, and the distances between the relief surfaces and the surfaces of the aqueous sodium sulfites were each several millimeters to 10 millimeters. The thus obtained products were dried in a current of heated air (60° C.) for 15 minutes using Dryer & Postexposure Equipment Model AL-100P (trade name of an apparatus sold by Asahi Chemical Ind. Co., Ltd., Japan) and then allowed to stand at room temperature for 30 minutes to obtain photocured relief-imaged plates. The surface tacks of the photocured relief-imaged plates were determined. The results are shown in Table 3 given below.

TABLE 3

| Example No. | Concentration of aqueous sodium sulfite used in post-exposure (wt %) | Surface tack of photocured relief-imaged plate (g) |
| --- | --- | --- |
| 19 | 0 (water) | 50 |
| 20 | 0.005 | 35 |
| 21 | 0.01 | 20 |
| 22 | 0.05 | 6 |
| 23 | 0.1 | 0 |
| 24 | 0.5 | 0 |

COMPARATIVE EXAMPLE 4

Substantially the same procedures as in Comparative Example 1 were repeated to prepare a photocured relief-imaged plate, except that the post-exposure was effected in a 0.1 wt % aqueous sodium sulfite instead of water. The surface tack of the photocured releif-imaged plate thus obtained was determined. The results obtained are shown in Table 4 given below. For comparison, the data with respect to the photocured relief-imaged plates obtained in Examples 1 and 17 and Comparative Example 1 are also shown in Table 4.

TABLE 4

| Example | Photosensitive resin composition Photocurable resin composition | Photosensitive resin composition Compound (I) (Amount: parts) | Solution used in post-exposure | Surface tack of photocured relief-imaged plate (g) Immediately after drying*1 | Surface tack of photocured relief-imaged plate (g) After 3 hours*2 |
| --- | --- | --- | --- | --- | --- |
| Example 17 | (a) | Myristic acid (2) | 0.1 wt % aqueous sodium sulfite | 0 | 0 |
| Comparative Example 4 | (a) | None | 0.1 wt % aqueous sodium sulfite | 500 | 500 |

TABLE 4-continued

| Example | Photosensitive resin composition Photocurable resin composition | Compound (I) (Amount: parts) | Solution used in post-exposure | Surface tack of photocured relief-imaged plate (g) Immediately after drying*1 | After 3 hours*2 |
|---|---|---|---|---|---|
| Example 1 | (a) | Myristic acid (2) | Water | 50 | 0 |
| Comparative Example 1 | (a) | None | " | 500 | 500 |

Note:
*1 Immediately after the resulting photocured relief-imaged plate was dried at 60° C. for 15 minutes.
*2 After the resulting photocured relief-imaged plate was dried at 60° C. for 15 minutes and then allowed to stand at room temperature for 3 hours.

EXAMPLES 25 TO 28

Substantially the same procedures as in Example 17 were repeated to prepare photocured relief-imaged plates, except that the post-exposure was effected in various aqueous solutions shown in Table 5 instead of 0.1 wt % aqueous sodium sulfite. The surface tacks of the resulting photocured relief-imaged plates were determined. The results are shown in Table 5.

TABLE 5

| Example No. | Solution*1 used in post-exposure | Surface tack of photocured relief-imaged plate (g) Immediately after drying*2 | After 3 hours*3 |
|---|---|---|---|
| Example 25 | Sodium thiosulfate | 113 | 10 |
| Example 26 | Grape sugar | 40 | 0 |
| Example 27 | Potassium sulfite | 0 | 0 |
| Example 28 | Calcium sulfite | 0 | 0 |

Note:
*1 1 wt % aqueous solution
*2 Immediately after the resulting photocured relief-imaged plate was dried at 60° C. for 15 minutes.
*3 After the resulting photocured relief-imaged plate was dried at 60° C. for 15 minutes and then allowed to stand at room temperature for 3 hours.

What is claimed is:

1. A photosensitive resin composition for use in preparing a printing plate for flexography which is improved with respect to surface tack-free characteristics after curing by exposure to actinic radiation, comprising:
   (a) an ethylenically unsaturated prepolymer having a number average molecular weight of 5000 or more per double bond and at least one urethane bond;
   (b) an ethylenically unsaturated monomer;
   (c) a photoinitiator; and
   (d) at least one compound represented by the general formula (I)

$$R^1-X \quad (I)$$

wherein $R^1$ represents a monovalent hydrocarbon residue represented by $C_nH_{2n+1}$ or $C_nH_{2n-1}$ in which n is an integer of from 11 to 21; and X represents $-COOH$, $-CONH_2$ or $-CH_2OR^2$ in which $R^2$ represents H or $-CO-R^3-S-R^3-COOCH_2-R^4$ in which $R^3$ is a divalent hydrocarbon residue having 1 to 6 carbon atoms and $R^4$ has the same meaning as $R^1$, the weight ratio of said at least one compound to the total weight of said ethylenically unsaturated prepolymer, said ethylenically unsaturated monomer and said photoinitiator being 0.1/100 to 6/100.

2. A photosensitive resin composition according to claim 1, which further comprises a binder polymer.

3. A photosensitive resin composition according to claim 1, wherein said ethylenically unsaturated prepolymer is an unsaturated polyurethane (meth)acrylate.

4. A photosensitive resin composition according to claim 1, wherein said at least one compound is a saturated or unsaturated aliphatic carboxylic acid having 14 to 18 carbon atoms.

5. A photosensitive resin composition according to claim 1, wherein said at least one compound is a saturated or unsaturated aliphatic alcohol having 14 to 18 carbon atoms.

6. A photosensitive resin composition according to claim 1, wherein said at least one compound is palmitic acid amide or oleic amide.

7. A photosensitive resin composition according to claim 1, wherein said at least one compound is dimyristyl thiodipropionate or dilauryl thiodipropionate.

* * * * *